United States Patent
Huang (10) Patent No.: US 9,685,221 B1
(45) Date of Patent: Jun. 20, 2017

(54) MEMORY CONTROL CIRCUIT UNIT, MEMORY STORAGE DEVICE AND REFERENCE VOLTAGE GENERATION METHOD

(71) Applicant: PHISON ELECTRONICS CORP., Miaoli (TW)

(72) Inventor: Ming-Chien Huang, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/241,094

(22) Filed: Aug. 19, 2016

(30) Foreign Application Priority Data

Jun. 20, 2016 (TW) .............................. 105119349 A (51) Int. Cl.
| G11C 16/30 | (2006.01) |
| G11C 11/4074 | (2006.01) |
| G11C 11/4076 | (2006.01) |

(52) U.S. Cl.
CPC ...... *G11C 11/4074* (2013.01); *G11C 11/4076* (2013.01); *G11C 16/30* (2013.01)

(58) Field of Classification Search
CPC ................................ G11C 5/147; G11C 16/30
USPC ............................................. 365/189.09, 226
See application file for complete search history.

(56) References Cited

U.S. PATENT DOCUMENTS

| 5,309,396 | A  | * | 5/1994  | Kimura   | G11C 5/141  |
|           |    |   |         |          | 365/189.05  |
| 5,343,437 | A  | * | 8/1994  | Johnson  | G11C 11/005 |
|           |    |   |         |          | 365/185.13  |
| 6,949,949 | B2 | * | 9/2005  | Lundberg | H03K 19/0005|
|           |    |   |         |          | 326/30      |
| 7,080,222 | B1 | * | 7/2006  | Srinivasagam | G06F 12/0638 |
|           |    |   |         |          | 711/104     |
| 8,040,750 | B2 | * | 10/2011 | Cagno    | G11C 5/141  |
|           |    |   |         |          | 365/228     |
| 8,233,336 | B2 | * | 7/2012  | Mueller  | G06F 13/1694|
|           |    |   |         |          | 365/189.07  |
| 8,271,718 | B2 | * | 9/2012  | Nakajima | G06F 3/0605 |
|           |    |   |         |          | 711/103     |
| 8,289,784 | B2 | * | 10/2012 | Fox      | G11C 29/02  |
|           |    |   |         |          | 326/30      |

(Continued)

FOREIGN PATENT DOCUMENTS

WO          2014105537        7/2014

OTHER PUBLICATIONS

"Office Action of Taiwan Counterpart Application", issued on Apr. 11, 2017, p. 1-p. 8.

*Primary Examiner* — Michael Tran
(74) *Attorney, Agent, or Firm* — Jianq Chyun IP Office (57) ABSTRACT

A memory control circuit unit, a memory storage device and a reference voltage generation method are provided. The method comprises: detecting a first impedance characteristic of a memory controller via a first connection interface of a memory interface and detecting a second impedance characteristic of a volatile memory via a second connection interface of the memory interface; generating an internal reference voltage according to a detection result; and resolving data signal received by the memory interface according to the internal reference voltage. Therefore, an influence on the internal reference voltage owing to the manufacture deviation of impedance element of the memory controller and/or the volatile memory can be reduced.

31 Claims, 3 Drawing Sheets

(56) References Cited

U.S. PATENT DOCUMENTS

| | | | |
|---|---|---|---|
| 8,681,546 B2* | 3/2014 | Fai ..................... | G11C 7/1057 |
| | | | 365/185.05 |
| 8,681,571 B2* | 3/2014 | Fox ................ | H03K 19/017545 |
| | | | 365/189.09 |
| 9,378,820 B2* | 6/2016 | Nam ..................... | G11C 16/08 |

* cited by examiner

MEMORY CONTROL CIRCUIT UNIT, MEMORY STORAGE DEVICE AND REFERENCE VOLTAGE GENERATION METHOD

CROSS-REFERENCE TO RELATED APPLICATION

This application claims the priority benefit of Taiwan application serial no. 105119349, filed on Jun. 20, 2016. The entirety of the above-mentioned patent application is hereby incorporated by reference herein and made a part of this specification.

BACKGROUND

Technical Field

The present disclosure relates to a reference voltage generation method of a memory controller, and particularly relates to a memory control circuit unit, a memory storage device and a reference voltage generation method.

Description of Related Art

The markets of digital cameras, cellular phones, and MP3 players have been expanded rapidly in recent years, resulting in escalated demand for storage media by consumers. The characteristics of data non-volatility, low power consumption, compact size and non-mechanical structure and so forth make rewritable non-volatile memory module (e.g., flash memory) ideal for being built in the portable multi-media devices as cited above.

As the development of memory technology, the storage capacity and data access speed of volatile memory are increased as well. Particularly, double data rate synchronous dynamic random access memory (DDR SDRAM) is applied widely to desktop computers, notebook computers and memory storage devices, in order to increase data access efficiency.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The present disclosure provides a memory control circuit unit, a memory storage device and a reference voltage generation method, which can dynamically generate an internal reference voltage in a memory interface via detecting the impedance of use environment.

An exemplary embodiment of the present disclosure provides a memory control circuit unit, which is configured to control a volatile memory. The memory control circuit unit comprises a processor core, a memory controller and a memory interface. The memory controller is coupled to the processor core. The memory interface is coupled to the memory controller and the volatile memory, wherein the memory interface is configured to detect a first impedance characteristic of the memory controller, detect a second impedance characteristic of the volatile memory and generate an internal reference voltage according to a detection result, wherein a voltage value of the internal reference voltage is positively correlated to a voltage value of a supply voltage of the memory controller, and the internal reference voltage is for resolving a data signal received by the memory interface.

Another exemplary embodiment of the present disclosure provides a memory storage device, which comprises a connection interface unit, a rewritable non-volatile memory module, a volatile memory and a memory control circuit unit. The connection interface unit is configured to couple to a host system. The memory control circuit unit is coupled to the connection interface unit, the rewritable non-volatile memory module and the volatile memory, wherein the memory control circuit unit is configured to detect a first impedance characteristic of a memory controller, detect a second impedance characteristic of the volatile memory and generate an internal reference voltage according to a detection result, wherein a voltage value of the internal reference voltage is positively correlated to a voltage value of a supply voltage of the memory controller, and the internal reference voltage is for resolving a data signal received by the memory control circuit unit.

Another exemplary embodiment of the present disclosure provides a reference voltage generation method, for a memory interface for connecting a memory controller to a volatile memory. The reference voltage generation method comprises: detecting a first impedance characteristic of the memory controller via a first connection interface of the memory interface and detecting a second impedance characteristic of the volatile memory via a second connection interface of the memory interface; generating an internal reference voltage according to a detection result, wherein a voltage value of the internal reference voltage is positively correlated to a voltage value of a supply voltage of the memory controller; and resolving a data signal received by the memory interface according to the internal reference voltage.

As above, the present disclosure is capable of detecting the present impedance characteristic of the memory controller and the volatile memory, in order to dynamically generate, in the memory interface, the internal reference voltage for accessing the volatile memory. Because the internal reference voltage is generated with reference to the impedance characteristic of the present use environment, the influence on the internal reference voltage owing to manufacture deviation of the impedance element of the memory controller and/or the volatile memory can be reduced.

In order to make the aforementioned and other features and advantages of the disclosure more comprehensible, embodiments accompanying figures are described in detail below.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A plurality of exemplary embodiments are provided below to describe the disclosure, though the disclosure is not limited to the provided exemplary embodiments, and the exemplary embodiments can also be suitably combined. A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, a term "signal" refers to at least a current, a voltage, an electric charge, a temperature, data or any other one or a plurality of signals.

Figure 1:
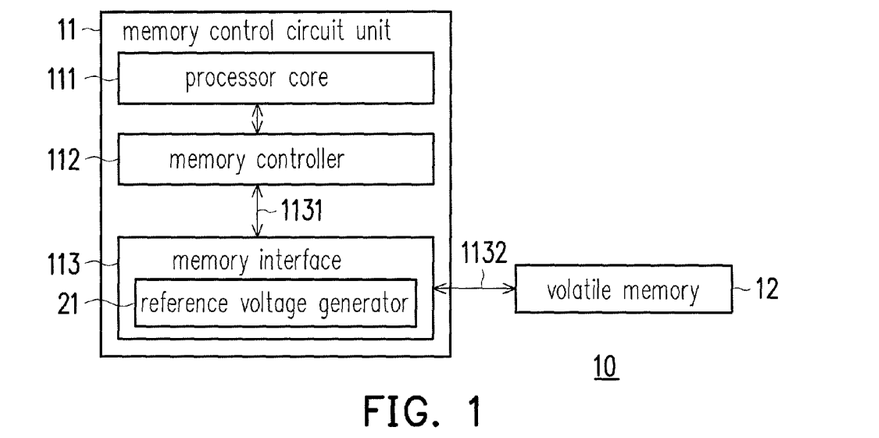
FIG. 1 is a schematic diagram illustrating a memory storage device according to an exemplary embodiment of the present disclosure.

FIG. 1 is a schematic diagram illustrating a memory storage device according to an exemplary embodiment of the present disclosure.

Please refer to FIG. 1, a memory storage device 10 includes a memory control circuit unit 11 and a volatile memory 12. The memory control circuit unit 11 can be packaged as a chip or composed of electronic circuit components laid out on at least one circuit board. In the present exemplar embodiment, the volatile memory 12 is a double data rate 4 synchronous dynamic random access memory (DDR 4 SDRAM). In an exemplary embodiment, the volatile memory 12 can include other types of dynamic random access memory. For example, in another exemplary embodiment, the volatile memory 12 can be a combination of a double data rate 3 synchronous dynamic random access memory (DDR 3 SDRAM) and a DDR 4 SDRAM. Moreover, the total number of the volatile memory 12 can be one or plural.

In the present exemplary embodiment, the memory control circuit unit 11 and the volatile memory 12 are installed on the same circuit board in the memory storage device 10. A data accessing operation on the volatile memory 12 is supported by the memory control circuit unit 11. In an exemplary embodiment, the memory control circuit unit 11 is regarded as a control chip of the volatile memory 12, and the volatile memory 12 is regarded as a cache memory or a buffer memory of the memory control circuit unit 11.

The memory control circuit unit 11 includes a processor core 111, a memory controller 112 and a memory interface 113. The memory controller 112 is coupled to the processor core 111 and the memory interface 113. The processor core 111 is configured to control the overall operations of the memory control circuit unit 11 or the memory storage device 10. For example, the processor core 111 can include a processor chip, such as a single-core or multi-core central processing unit (CPU) or a micro-processor.

The memory controller 112 is served for communication between the processor core 111 and the volatile memory 12, and is exclusively applied for controlling the volatile memory 12. In an exemplary embodiment, the memory controller 112 is also referred to as a dynamic random access memory (DRAM) controller.

The memory interface 113 is configured to connect the memory controller 112 to the volatile memory 12. When the processor core 111 is instructed to read data from the volatile memory 12 or store data to the volatile memory 12, corresponding command sequence is sent by the memory controller 112 to the volatile memory 12 via the memory interface 113. When the command sequence is received by the volatile memory 12, a write data corresponding to the command sequence is stored by the volatile memory 12, or a read data corresponding to the command sequence is returned by the volatile memory 12 to the memory controller 112 via the memory interface 113. In addition, in the memory interface 113, the write data or the read data is transmitted as a form of data signal. For example, the data signal can be applied to transmit bit data including a bit of "1" and a bit of "0". In particular, because the volatile memory 12 is a double data rate synchronous dynamic random access memory, rising edges and falling edges of a clock signal of the memory interface 113 can both be applied to resolve (e.g., to generate or to sample) the data signal from the volatile memory 12 or the data signal to be transmitted to the volatile memory 12. In other words, in one clock cycle, two times of data writing or reading can be executed by the memory interface 113 on the volatile memory 12.

In the present exemplary embodiment, the memory interface 113 includes a connection interface 1131 and a connection interface 1132. The connection interface 1131 is configured to connect the memory controller 112 and the memory interface 113, and the connection interface 1132 is configured to connect the memory interface 113 and the volatile memory 12. For example, the connection interface 1131 and the connection interface 1132 respectively include a plurality of conducting pins. In the present exemplary embodiment, these conducting pins include at least one pin applied to transmit data signal (also referred to as a data pin). For example, the data pin can be a DQ pin. Accordingly, the data signal can be transmitted between the memory controller 112 and the volatile memory 12 via the respective data pins of the connection interface 1131 and the connection interface 1132. In another exemplary embodiment, these conducting pins can further include any functional pins as well, as long as they are complied with the adopted connection protocol.

Figure 2A:
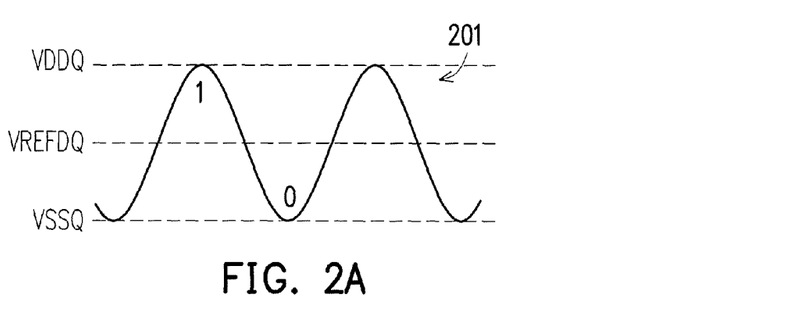
FIG. 2A is a schematic diagram illustrating a data signal according to an exemplary embodiment of the present disclosure.

FIG. 2A is a schematic diagram illustrating a data signal according to an exemplary embodiment of the present disclosure.

Please refer to FIG. 2A, the data signal 201 is transmitted as a form of pulse, wherein an upper voltage limit of the data signal 201 (i.e., an upper threshold voltage) is determined by a supply voltage VDDQ of the memory controller 112, and a lower voltage limit of the data signal 201 (i.e., a lower threshold voltage) is determined by a ground voltage VSSQ of the volatile memory 12. For example, the upper threshold voltage of the data signal 201 is equal or approximate to the voltage value of the supply voltage VDDQ, and the lower threshold voltage of the data signal 201 is equal or approximate to the voltage value of the ground voltage VSSQ. By changing the waveform of the data signal 201, the corresponding bit data can be transmitted.

In order to generate and/or resolve the data signal 201, an internal reference voltage VREFDQ is determined, as shown in FIG. 2A. The voltage value of the internal reference voltage VREFDQ follows (e.g., be positively correlated to) the voltage value of the supply voltage VDDQ. When generating the data signal 201 to transmit the bit data, in correspondence to a bit of "1", the voltage value of the data signal 201 is raised, such as being raised to the upper threshold voltage (which is higher than the voltage value of the internal reference voltage VREFDQ); and in correspondence to a bit of "0", the voltage value of the data signal 201 is lowered, such as being lowered to the lower threshold voltage (which is lower than the voltage value of the internal reference voltage VREFDQ). Afterward, when resolving the data signal 201 to acquire the bit data, if a sampled voltage value of a specific sampling point of the data signal 201 is higher than the voltage value of the internal reference voltage VREFDQ, the bit data corresponding to this sample point may be determined to be a bit "1". Otherwise, if the sampled voltage value of a specific sample point of the data signal 201 is lower than the voltage value of the internal reference voltage VREFDQ, the bit data corresponding to this sample point may be determined to be a bit "0". Alternatively, in another exemplary embodiment, the corresponding voltage values of a bit "0" and a bit "1" in the data signal can be exchanged. For example, a bit "0" is represented by the voltage value higher than the internal reference voltage VREFDQ, and a bit "1" is represented by the voltage value lower than the internal reference voltage VREFDQ.

In general, if the volatile memory 12 is a double data rate synchronous dynamic random access memory (DDR SDRAM), a double data rate 2 synchronous dynamic random access memory (DDR 2 SDRAM) or a DDR 3 SDRAM, the voltage value of the internal reference voltage is about half of the voltage value of the supply voltage. However, if the volatile memory 12 includes a DDR 4 SDRAM, the voltage value of the internal reference voltage is usually higher than half of the voltage value of the supply voltage. For example, in FIG. 2A, the voltage value of the internal reference voltage VREFDQ may be 0.64, 0.75 or so forth times the voltage value of the supply voltage VDDQ. In an exemplary embodiment, the voltage value of the internal reference voltage VREFDQ is regarded as being higher than 0.6 times the voltage value of the supply voltage VDDQ.

Therefore, if the volatile memory 12 includes a DDR 4 SDRAM, the voltage value of the internal reference voltage VREFDQ is usually acquired through calculation. For example, according to a pre-determined impedance value of an on-die termination (ODT) impedance element of the memory controller 112 and a pre-determined impedance value of an off-chip driver (OCD) impedance element of the volatile memory 12, developers can calculate an ideal internal reference voltage VREFDQ. For example, if the ideal impedance value of the ODT impedance element is 34 Ohm and the ideal impedance value of the OCD impedance element impedance element is 120 Ohm, the ideal voltage value of the internal reference voltage VREFDQ may be equal to 0.61 times the voltage value of the supply voltage VDDQ (e.g., VREFDQ=VDDQ×[(34×(120+34)+1)/2]= VDDQ×0.61).

However, according to manufacture deviation, the real impedance value of the ODT impedance element and the real impedance value of the OCD impedance element may both be deviated, so that a deviation exists between the ideal voltage value of the internal reference voltage VREFDQ and the voltage value of the internal reference voltage VREFDQ actually required. For example, based on manufacture deviation, the real impedance value of the ODT impedance element may be 39.1 Ohm (the ideal value is 34 Ohm), and the real impedance value of the OCD impedance element may be 102 Ohm (the ideal value is 120 Ohm). Thus, the voltage value of the internal reference voltage VREFDQ actually required is 0.64 times the voltage value of the supply voltage VDDQ (e.g., VREFDQ=VDDQ×[(39.1× (102+39.1)+1)/2]=VDDQ×0.64). In the example described above, the deviation of 3% may result in some error in data reading and writing.

In general, in order to correct the deviation of 3%, a plurality of data access operations may be executed on the volatile memory 12 by the memory controller 112, and the internal reference voltage VREFDQ may be gradually corrected according to the correctness of the obtained read data, so that the corrected voltage value of the internal reference voltage VREFDQ may slowly approximate the voltage value of the internal reference voltage VREFDQ actually required. Nevertheless, if the operations of the above-mentioned calculation and correction of the internal reference voltage VREFDQ have to be executed every time the memory storage device 10 is powered on (e.g., booted), the boot time of the memory storage device 10 is prolonged. Furthermore, the correctness of the internal reference voltage VREFDQ being corrected may be affected by the interference of channel noise, and the internal reference voltage VREFDQ being corrected may rather become less correct when the interference is severe. However, in the present exemplary embodiment, the memory interface 113 can detect the impedance information of the present use environment and generate the required internal reference voltage VREFDQ automatically. Because the internal reference voltage VREFDQ conforms to the impedance of the present use environment, the memory controller 112 is not required to calculate the ideal internal reference voltage VREFDQ and/or correct the internal reference voltage VREFDQ through a plurality of data access operations. Accordingly, the boot time of the memory storage device 10 can be shortened, and the determined internal reference voltage VREFDQ is more accurate.

Please refer to FIG. 1 again, the memory interface 113 further includes a reference voltage generator 21. After the memory storage device 10 is powered on (e.g., booted), the impedance characteristic of the memory controller 112 (also referred to as a first impedance characteristic) is detected by the reference voltage generator 21 via the connection interface 1131 (also referred to as a first connection interface), and the impedance characteristic of the volatile memory 12 (also referred to as a second impedance characteristic) is detected by the reference voltage generator 21 via the connection interface 1132 (also referred to as a second connection interface). In an exemplary embodiment, the first impedance characteristic corresponds to the impedance characteristic of the ODT impedance element of the memory controller 112, and the second impedance characteristic corresponds to the impedance characteristic of an OCD impedance element of the volatile memory 12. According to the detection result, the internal reference voltage VREFDQ corresponding to the data signal (e.g., the data signal 201 shown in FIG. 2A) of the volatile memory 12 is generated by the reference voltage generator 21. For example, the internal reference voltage VREFDQ can be applied to generate and/or resolve the data signal transmitted to the volatile memory 12 or the data signal from the volatile memory 12 via the memory interface 113.

Since the internal reference voltage VREFDQ is generated according to the actually detected impedance characteristics of the memory controller 112 and the volatile memory 12, even though manufacture deviation exists in any one of the ODT impedance element and the OCD impedance element, the voltage value of the internal reference voltage VREFDQ generated by the reference voltage generator 21 still conforms to the calculation result calculated by applying the actual impedance characteristics of the ODT impedance element and the OCD impedance element. For example, in comparison with the above-mentioned example of repeatedly executing data access operations on the volatile memory 12 to correct the error of 3% after the ideal internal reference voltage VREFDQ is calculated, the internal reference voltage VREFDQ conforms to the present use environment can be generated directly by the reference voltage generator 21, and the internal reference voltage VREFDQ can be applied (or used) directly. In an exemplary embodiment, after the internal reference voltage VREFDQ is generated by the reference voltage generator 21, the internal reference voltage VREFDQ can still be corrected by the memory controller 112 via at least one data access operation.

Figure 2B:
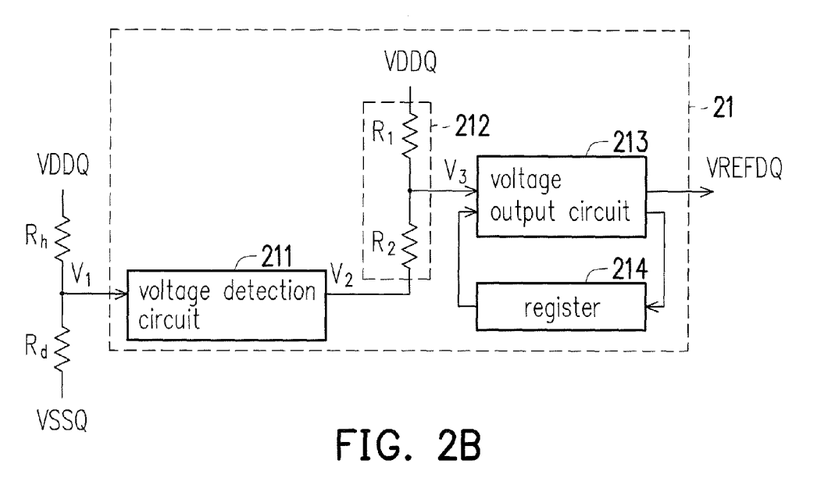
FIG. 2B is a schematic diagram illustrating a reference voltage generator according to an exemplary embodiment of the present disclosure.

FIG. 2B is a schematic diagram illustrating a reference voltage generator according to an exemplary embodiment of the present disclosure.

Please refer to FIG. 2B, in the present exemplary embodiment, the equivalent resistance of the ODT impedance element of the memory controller 112 is represented by a resistance $R_h$, and the equivalent resistance of the OCD impedance element of the volatile memory 12 is represented by a resistance $R_d$. In particular, in the present exemplary embodiment, the volatile memory 12 is a DDR 4 SDRAM, so that a first terminal of the resistance $R_h$ is coupled to the supply voltage VDDQ, a first terminal of the resistance $R_d$ is coupled to the ground voltage VSSQ, and a second terminal of the resistance $R_h$ is coupled to a second terminal of the resistance $R_d$. For example, if the first terminal of the resistance $R_h$ is coupled to the supply voltage VDDQ, the memory interface 113 can be regarded as being complied with a pseudo open drain (POD) input/output (I/O) protocol of the DDR 4 SDRAM. In addition, in other exemplary embodiments, if the volatile memory 12 is the model earlier than the DDR 4 SDRAM (e.g., the DDR SDRAM, the DDR 2 SDRAM or the DDR 3 SDRAM), the first terminal of the resistance $R_h$ is usually coupled to half of the supply voltage VDDQ (i.e., VDDQ/2). For example, if the first terminal of the resistance $R_h$ is coupled to half of the supply voltage VDDQ, the memory interface 113 can be regarded as being complied with a stub series terminated logic (SSTL) I/O protocol, such as a SSTL-2, a SSTL-3, a SSTL-15 or a SSTL-18.

In an exemplary embodiment, if the volatile memory 12 is a double data rate synchronous dynamic random access memory other than the DDR 4 SDRAM, the voltage value of the supply voltage VDDQ can be 2.5 volt applied to the DDR SDRAM, 1.8 volt applied to the DDR 2 SDRAM or 1.5 volt applied to the DDR 3 SDRAM. However, in the present exemplary embodiment, the volatile memory 12 is the DDR 4 SDRAM, thus the voltage value of the supply voltage VDDQ is lower than (or equal to) 1.2 volt, and the voltage value of the reference voltage VREFDQ is not equal to half of the voltage value of this supply voltage VDDQ.

In the present exemplary embodiment, according to the POD I/O protocol, when a specific data pin of the memory interface 113 is at high potential, there is no current flowing through the corresponding OCD impedance element, thus the power consumption of the memory interface 113 is decreased. Therefore, if more data pins each at high potential, the power consumption of the memory interface 113 can be further decreased.

In an exemplary embodiment, a mechanism of data bus inversion (DBI) is further supported by the memory interface 113. For example, a plurality of conductive pins of the memory interface 113 may include a DBI pin, which is configured to instruct the potential inversion of the data pins. For example, assuming that the data signal is transmitted by the memory interface 113 via 8 DQ pins. When the pins of more than or equal to half of this 8 DQ pins (e.g., more than or equal to 4 of the DQ pins) are at low potential, this DBI pin may be pulled up to high potential and every DQ pin at low potential is inverted to high potential. On the contrary, when the pins of less than half of this 8 DQ pins (e.g., less than or equal to 3 of the DQ pins) are at low potential, this DBI pin and every DQ pin at low potential are maintained at low potential. Accordingly, during the process of synchronous data transmission, more than half of the multiple data pins of the memory interface 113 are maintained at high potential at the same time, which attains the effect of saving the power consumption of data transmission.

Please refer to FIG. 2B again, in the present exemplary embodiment, the reference voltage generator 21 includes a voltage detection circuit 211, a voltage dividing circuit 212 and a voltage output circuit 213. The input terminal of the voltage detection circuit 211 is coupled between the resistance $R_h$ and the resistance $R_d$. For example, the input terminal of the voltage detection circuit 211 is connected to a specific data pin of the connection interface 1131 to detect the impedance characteristic of the resistance $R_h$ (i.e., the first impedance characteristic) and is connected to a specific data pin of the connection interface 1132 to detect the impedance of the resistance $R_d$ (i.e., the second impedance characteristic). In response to the first impedance characteristic and the second impedance characteristic, a voltage $V_1$ (also referred to as a first voltage) is detected by the voltage detection circuit 211, as shown in FIG. 2B.

In the present exemplary embodiment, the voltage value of the supply voltage VDDQ is higher than the voltage value of the ground voltage VSSQ, thus after voltage is divided by the resistance $R_h$ and the resistance $R_d$, the voltage value of the voltage $V_1$ is positively correlated to the voltage value of the supply voltage VDDQ. Afterward, a voltage $V_2$ (also referred to as a second voltage) is generated by the voltage detection circuit 211 according to the voltage $V_1$ being detected, wherein the voltage value of the voltage $V_2$ is locked at or approximate to the voltage value of the voltage $V_1$.

Figure 3:
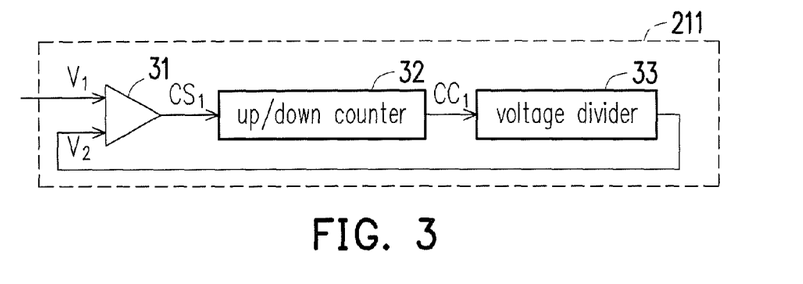
FIG. 3 is a schematic diagram illustrating a voltage detection circuit according to an exemplary embodiment of the present disclosure.

FIG. 3 is a schematic diagram illustrating a voltage detection circuit according to an exemplary embodiment of the present disclosure.

Please refer to FIG. 3, the voltage detection circuit 211 includes a comparator 31 (also referred to as a first comparator), an up/down counter 32 (also referred to as a first up/down counter) and a voltage divider 33 (also referred to as a first voltage divider). The up/down counter 32 is connected between the comparator 31 and the voltage divider 33. The comparator 31 is configured to compare the voltage $V_1$ and the voltage $V_2$ and generate a comparison signal $CS_1$ (also referred to as a first comparison signal) according to the comparison result. The up/down counter 32 is configured to generate a count signal $CC_1$ (also referred to as a first count signal) according to the comparison signal $CS_1$. In the present exemplary embodiment, the up/down counter 32 is a 7-bits up/down counter, but the up/down counter 32 can still be the other types of counter, the present disclosure is not limited thereto. The voltage divider 33 is configured to output the voltage $V_2$ according to the count signal $CC_1$. In the present exemplary embodiment, the voltage divider 33 is a poly divider. For example, in correspondence to the up/down counter 32 being a 7-bits up/down counter, the voltage divider 33 can be a 7-bits poly divider. However, in another exemplary embodiment, the voltage divider 33 can also be other types of voltage divider, the present disclosure is not limited thereto.

Particularly, if the present comparison result of the comparator 31 shows that the voltage value of the voltage $V_1$ is higher than the voltage value of the voltage $V_2$, the voltage value of the voltage $V_2$ is raised by the voltage divider 33. If the present comparison result of the comparator 31 shows that the voltage value of the voltage $V_1$ is lower than the voltage value of the voltage $V_2$, the voltage value of the voltage $V_2$ is lowered by the voltage divider 33. By the operations of the comparator 31, the up/down counter 32 and the voltage divider 33, the voltage value of the voltage $V_2$ gradually approaches the voltage value of the voltage $V_1$ until the voltage value of the voltage $V_2$ is locked at the voltage value of the voltage $V_1$ or approximate to the voltage value of the voltage $V_1$. When the voltage value of the voltage $V_2$ is locked at the voltage value of the voltage $V_1$ or approximate to the voltage value of the voltage $V_1$, the comparison result of the comparator 31 changes continuously. For example, if the last comparison result shows that the voltage value of the voltage $V_1$ is higher than the voltage value of the voltage $V_2$ while the present comparison result shows that the voltage value of the voltage $V_1$ is lower than the voltage value of the voltage $V_2$, or the last comparison result show that the voltage value of the voltage $V_1$ is lower than the voltage value of the voltage $V_2$ while the present comparison shows that the voltage value of the voltage $V_1$ is higher than the voltage value of the voltage $V_2$, it means that the comparison result changes continuously.

Please refer to FIG. 2B again, the voltage dividing circuit 212 is coupled to the voltage detection circuit 211 and is configured to execute a voltage dividing operation on the voltage $V_2$ of the output terminal of the voltage detection circuit 211. For example, in the present exemplary embodiment, the voltage dividing circuit 212 includes an impedance element $R_1$ (also referred to as a first impedance element) and an impedance element $R_2$ (also referred to as a second impedance element), wherein the impedance element $R_1$ and the impedance element $R_2$ have the same resistance value or close resistance values. For example, the impedance element $R_1$ and the impedance element $R_2$ respectively include at least one resistance. A first terminal of the impedance element $R_1$ is coupled to the supply voltage VDDQ, and a second terminal of the impedance element $R_1$ is coupled to the input terminal of the voltage output circuit 213. A first terminal of the impedance element $R_2$ is coupled to the output terminal of the voltage detection circuit 211, and a second terminal of the impedance element $R_2$ is coupled to the second terminal of the impedance element $R_1$, as shown in FIG. 2B. In addition, the voltage value of the supply voltage VDDQ is higher than the voltage value of the voltage $V_2$, thus through voltage dividing of the voltage dividing circuit 212 (e.g., the impedance element $R_1$ and the impedance element $R_2$), the voltage value of the voltage $V_3$ (also referred to as a third voltage) of the output terminal of the voltage dividing circuit 212 is positively correlated to the voltage value of the supply voltage VDDQ as well.

The voltage output circuit 213 is coupled to the voltage dividing circuit 212 and is configured to generate the internal reference voltage VREFDQ in response to the voltage $V_3$ of the output terminal of the voltage dividing circuit 212. In the present exemplary embodiment, the voltage value of the internal reference voltage VREFDQ is locked at the voltage value of the voltage $V_3$ or approximate to the voltage value of the voltage $V_3$.

Figure 4:
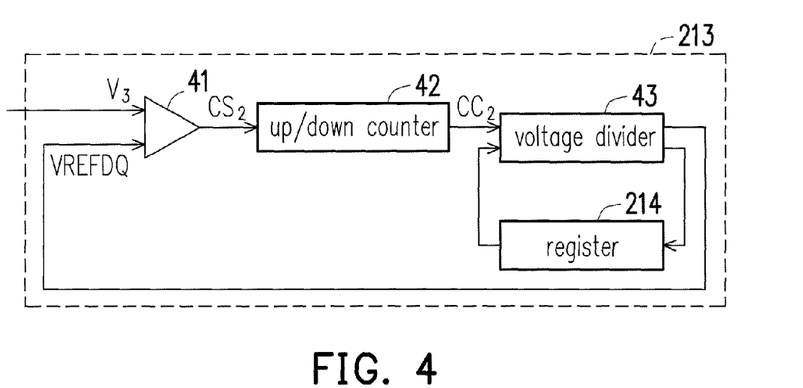
FIG. 4 is a schematic diagram illustrating a voltage output circuit according to an exemplary embodiment of the present disclosure.

FIG. 4 is a schematic diagram illustrating a voltage output circuit according to an exemplary embodiment of the present disclosure.

Please refer to FIG. 4, the voltage output circuit 213 includes a comparator 41 (also referred to as a second comparator), an up/down counter 42 (also referred to as a second up/down counter) and a voltage divider 43 (also referred to as a second voltage divider). The up/down counter 42 is connected between the comparator 41 and the voltage divider 43. The comparator 41 is configured to compare the voltage $V_3$ and the internal reference voltage VREFDQ and generate a comparison signal $CS_2$ (also referred to as a second comparison signal) according to the comparison result. The up/down counter 42 is configured to generate a count signal $CC_2$ (also referred to as a second count signal) according to the comparison signal $CS_2$. In the present exemplary embodiment, the up/down counter 42 is a 7-bits up/down counter. The voltage divider 43 is configured to output the internal reference voltage VREFDQ according to the count signal $CC_2$. In the present exemplary embodiment, the voltage divider 43 is a poly divider. For example, in correspondence to the up/down counter 42 being a 7-bits up/down counter, the voltage divider 43 can be a 7-bits poly divider. However, types of any one of the comparator 41, the up/down counter 42 and the voltage divider 43 are not limited in the present disclosure, any type is available so long as it can suffice required functions.

Similar to the voltage detection circuit 211 of FIG. 3, by the operations of the comparator 41, the up/down counter 42 and the voltage divider 43, the voltage value of the internal reference voltage VREFDQ gradually approaches the voltage value of the voltage $V_3$ until the voltage value of the internal reference voltage VREFDQ is locked at the voltage value of the voltage $V_3$ or approximate to the voltage value of the voltage $V_3$. When the voltage value of the internal reference voltage VREFDQ is locked at the voltage value of the voltage $V_3$ or approximate to the voltage value of the voltage $V_3$, the comparison result of the comparator 41 changes continuously. For example, if the last comparison result shows that the voltage value of the internal reference voltage VREFDQ is higher than the voltage value of the voltage $V_3$ while the present comparison result shows that the voltage value of the internal reference voltage VREFDQ is lower than the voltage value of the voltage $V_3$, or the last comparison result shows that the voltage value of the internal reference voltage VREFDQ is lower than the voltage value of the voltage $V_3$ while the present comparison shows that the voltage value of the internal reference voltage VREFDQ is higher than the voltage value of the voltage $V_3$, it means the comparison result changes continuously.

In an exemplary embodiment, (only) after the internal reference voltage VREFDQ complies with a stable condition, the internal reference voltage VREFDQ is provided to be applied (or used) by the memory controller 112 and/or the memory interface 113. For example, the internal reference voltage VREFDQ complying with the stable condition is referred to as the voltage value of the internal reference voltage VREFDQ being locked at the voltage value of the voltage $V_3$ or approximate to the voltage value of the voltage $V_3$. Accordingly, it can be avoided that the internal reference voltage VREFDQ being unstable at the initial state, which results in excess errors in the data signal being transmitted.

Please refer to FIG. 2B again, in an exemplary embodiment, the reference voltage generator 21 further includes a register 214. The register 214 is coupled to the voltage output circuit 213 and is configured to temporarily store the control code corresponding to the generated internal reference voltage VREFDQ after the internal reference voltage VREFDQ is generated. The internal reference voltage VREFDQ (which is complying with the stable condition described above) can be output continuously by the voltage output circuit 213 according to this control code. For example, in an exemplary embodiment of FIG. 4, after the internal reference voltage VREFDQ is generated or the internal reference voltage VREFDQ is complied with the stable condition described above, the control code corresponding to the internal reference voltage VREFDQ is stored in the register 214 by the voltage divider 43, and the voltage divider 43 continues to generate the internal reference voltage VREFDQ according to this control code. In an exemplary embodiment, the register 214 can also be referred to as a memory unit of any type, the present disclosure is not limited thereto.

In an exemplary embodiment, after the internal reference voltage VREFDQ is generated or the internal reference voltage VREFDQ is complied with the stable condition, a part of electronic elements (or circuits) in the voltage output circuit 213 are disabled. For example, after the control code corresponding to the internal reference voltage VREFDQ complied with the stable condition is recorded in the register 214, the electronic elements (or circuits) in the voltage output circuit 213 not (directly) related to the operation of generating the internal reference voltage VREFDQ according to the control code (e.g., the comparator 41 and the up/down counter 42 in FIG. 4) can be disabled, so that a part of the operation power can be saved without affecting the internal reference voltage VREFDQ to be generated steadily.

In another exemplary embodiment as shown in FIG. 2B, after the voltage value of the voltage $V_2$ is locked at the voltage value of the voltage $V_1$ or approximate to the voltage value of the voltage $V_1$ (e.g., the voltage $V_1$ is complied with the stable condition), the control code corresponding to the voltage $V_2$ can also be stored by the voltage detection circuit 211 and then applied to generate the voltage $V_2$ thereafter. For example, similar to the voltage output circuit 213, the voltage detection circuit 211 may also have a register (not shown) applied to store the control code corresponding to the voltage $V_2$. Accordingly, the voltage $V_2$ can be generated steadily according to the stored control code, at the same time the electronic elements (or circuits) in the voltage detection circuit 211 no (directly) related to the operation of generating the voltage $V_2$ according to the control code (e.g., the comparator 31 and the up/down counter 32 in FIG. 3) can be disabled, so that a part of the operation power can also be saved.

Figure 5:
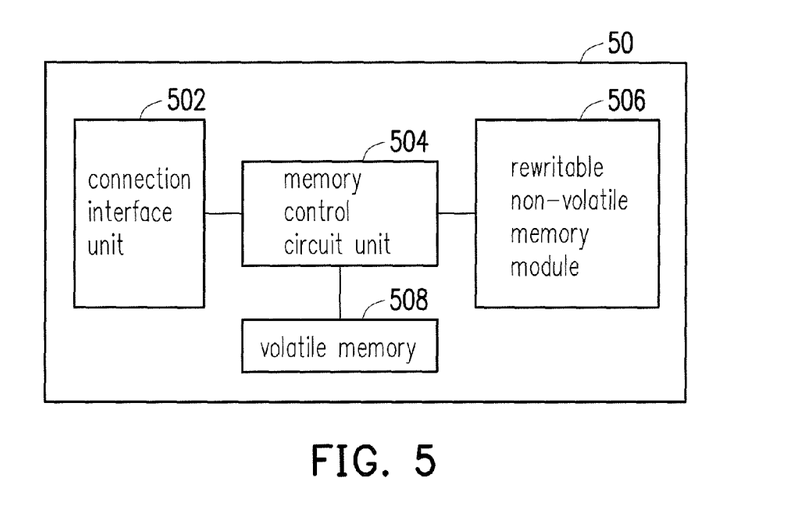
FIG. 5 is a schematic diagram illustrating a memory storage device according to another exemplary embodiment of the present disclosure.

FIG. 5 is a schematic diagram illustrating a memory storage device according to another exemplary embodiment of the present disclosure.

Please refer to FIG. 5, the memory storage device 50 is a memory storage device, such as a solid state drive (SSD) that includes both of a rewritable non-volatile memory module 506 and a volatile memory 508. The memory storage device 50 can be applied together with a host system, and data can be wrote to the memory storage device 50 or read from the memory storage device 50 by the host system. The above-mentioned host system can be any system that can be substantially co-operated with the memory storage device 50 to store data, such as a desktop computer, a laptop computer, a digital camera, a camera, a communication apparatus, an audio player, a video player, a tablet PC or so forth.

The memory storage device 50 includes a connection interface unit 502, a memory control circuit unit 504, the rewritable non-volatile memory module 506 and the volatile memory 508. The connection interface unit 502 is configured to connect the memory storage device 50 to the host system. In the present exemplary embodiment, the connection interface unit 502 is compatible with a serial advanced technology attachment (SATA) protocol. However, it should be understood that the disclosure is not limited hereto, and the connection interface unit 502 can also be compatible with a parallel advance technology attachment (PATA) protocol, a peripheral component interconnect express (PCI express) protocol, a universal serial bus (USB) protocol or other suitable protocols. The connection interface unit 502 and the memory control circuit unit 504 are packaged into one chip, or the connection interface unit 502 is distributed outside of a chip including the memory control circuit unit 504.

The memory control circuit unit 504 is configured to perform operations such as data writing, reading and erasing in the rewritable non-volatile memory module 506 according to the commands of the host system. The rewritable non-volatile memory module 506 is coupled to the memory control circuit unit 504 and configured to store the data written by the host system. The rewritable non-volatile memory module 506 can be a single level cell (SLC) NAND flash memory module (i.e., a flash memory module capable of storing one bit in one memory cell), multi level cell (MLC) NAND flash memory module (i.e., a flash memory module capable of storing two bits in one memory cell), triple level cell (TLC) NAND flash memory module (i.e., a flash memory module capable of storing three bits in one memory cell), and other flash memory modules or other memory modules having the same properties.

In the present exemplary embodiment, the memory control circuit unit 504 also has a function and/or an electronic circuit structure the same as, or similar with, the memory control circuit unit 11 described in the exemplary embodiments as shown in FIG. 1~FIG. 4, and the volatile memory 508 is the same as, or similar with, the volatile memory 12 described in the exemplary embodiment as shown in FIG. 1. Therefore, regarding the description of the memory control circuit unit 504 and the volatile memory 508, please refer to the exemplary embodiments as shown in FIG. 1~FIG. 4, which will not be described herein again.

It is noted that the electronic circuits illustrated in FIG. 2B, FIG. 3 and FIG. 4 are merely schematic diagrams of the reference voltage generator 21, the voltage detection circuit 211, the voltage dividing circuit 212 and the voltage output circuit 213 of a part of the exemplary embodiments, and those are not used to limit the scope of the present disclosure. In a part of the applications (or embodiments) that does not mentioned above, more electronic circuits can be added to any one of the reference voltage generator 21, the voltage detection circuit 211, the voltage dividing circuit 212 and the voltage output circuit 213, in order to provide additional functions. In addition, in a part of the applications (or embodiments) that does not mentioned above, the circuit layout and/or the elements coupling relationship of any one of the reference voltage generator 21, the voltage detection circuit 211, the voltage dividing circuit 212 and the voltage output circuit 213 can be changed appropriately, in order to meet actual requirements.

Figure 6:
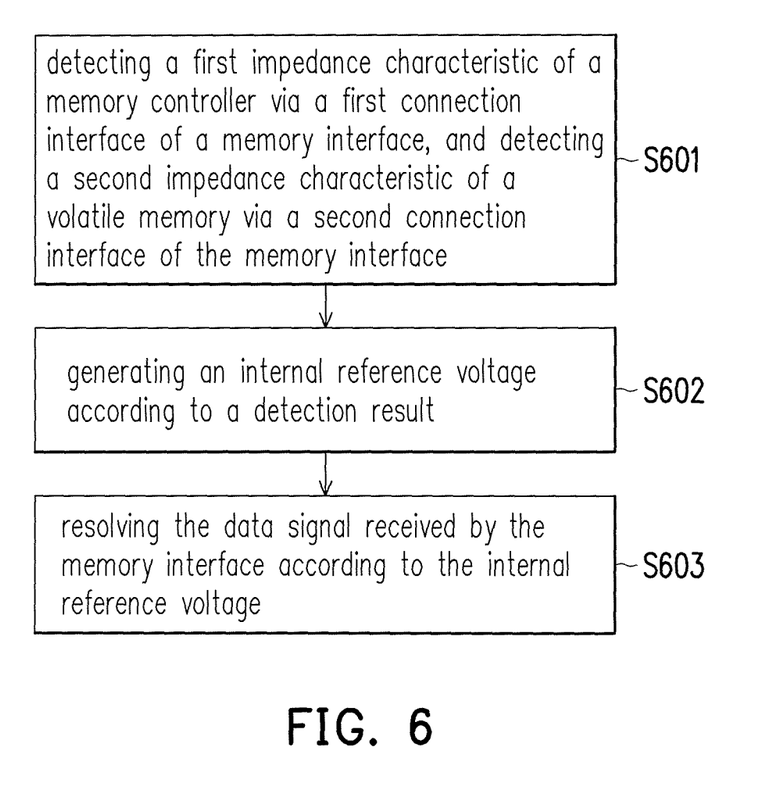
FIG. 6 is a flow chart illustrating a reference voltage generation method according to an exemplary embodiment of the present disclosure.

FIG. 6 is a flow chart illustrating a reference voltage generation method according to an exemplary embodiment of the present disclosure. The reference voltage generation method can be suitably applied to the memory storage device described in the exemplary embodiments as shown in FIG. 1 or FIG. 5. The reference voltage generation method will be described by using the memory storage device 10 as shown in FIG. 1, and in accompany with the FIG. 6.

Please refer to FIG. 1 and FIG. 6, in step S601, the impedance characteristic of the memory controller 112 is detected via the connection interface 1131 of the memory interface 113 and the impedance characteristic of the volatile memory 12 is detected via the connection interface 1132 of the memory interface 113. In step S602, an internal reference voltage (e.g., the internal reference voltage VREFDQ as shown in FIG. 2A) is generated according to the detection result of step S601, wherein the voltage value of the internal reference voltage is positively correlated to the voltage value of the supply voltage (e.g., the supply voltage VDDQ as shown in FIG. 2A) of the memory controller 112. Afterward, in step S603, the data signal (e.g., the data signal 201 as shown in FIG. 2A) received by the memory interface 113 is resolved according to the internal reference voltage. For example, when the data signal from the volatile memory 12 is resolved, rising edges and falling edges of a clock signal of the memory interface 113 can be applied for sampling this data signal.

However, every step in FIG. 6 has been described in details as above, which will not be described herein again. It is noted that, each step in FIG. 6 can be embodied as a plurality of programming codes or circuits, and the present disclosure is not limited thereto. Moreover, the method of FIG. 6 can be applied in accompany with the above-mentioned exemplary embodiments, or it can be applied on its own, the present disclosure is not limited thereto.

As above, the present disclosure is capable of detecting the present impedance characteristic of the memory controller and the volatile memory, in order to dynamically generate the internal reference voltage in the memory interface, wherein the internal reference voltage is applied for accessing the volatile memory. Because the internal reference voltage is generated with reference to the impedance characteristic of the present use environment, the influence on the internal reference voltage owing to manufacture deviation of the impedance element of the memory controller and/or the volatile memory can be reduced. In addition, the present disclosure is not required to calculate and correct the internal reference voltage with reference to the ideal impedance value of the ODT impedance element and the ideal impedance value of the OCD impedance element.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory control circuit unit, configured to control a volatile memory, the memory control circuit unit comprising:
   a processor core;
   a memory controller, coupled to the processor core; and
   a memory interface, coupled to the memory controller and the volatile memory,
   wherein the memory interface comprises:
   a first connection interface, configured to couple to the memory controller;
   a second connection interface, configured to couple to the volatile memory; and
   a reference voltage generator, coupled to the first connection interface and the second connection interface,
   wherein the reference voltage generator is configured to detect the first impedance characteristic of the memory controller via the first connection interface, detect the second impedance characteristic of the volatile memory via the second connection interface and generate the internal reference voltage according to the detection result,
   wherein a voltage value of the internal reference voltage is positively correlated to a voltage value of a supply voltage of the memory controller, and the internal reference voltage is for resolving a data signal received by the memory interface.

2. The memory control circuit unit as claimed in claim 1, wherein the reference voltage generator comprises:
   a voltage detection circuit, configured to detect a first voltage of an on-die termination impedance element in response to the first impedance characteristic and the second impedance characteristic,
   wherein a voltage value of the first voltage is positively correlated to the voltage value of the supply voltage of the memory controller.

3. The memory control circuit unit as claimed in claim 2, wherein the reference voltage generator further comprises:
   a voltage dividing circuit, coupled to the voltage detection circuit and configured to execute a voltage dividing operation on a second voltage of an output terminal of the voltage detection circuit; and
   a voltage output circuit, coupled to the voltage dividing circuit and configured to generate the internal reference voltage in response to a third voltage of an output terminal of the voltage dividing circuit.

4. The memory control circuit unit as claimed in claim 2, wherein the voltage detection circuit comprises:

a first comparator, configured to compare the first voltage and a second voltage and generate a first comparison signal;
a first up/down counter, coupled to the first comparator and configured to generate a first count signal according to the first comparison signal; and
a first voltage divider, coupled to the first up/down counter and configured to output the second voltage according to the first count signal.

5. The memory control circuit unit as claimed in claim 3, wherein the voltage dividing circuit comprises:
a first impedance element, wherein a first terminal of the first impedance element is coupled to the supply voltage of the memory controller, a second terminal of the first impedance element is coupled to an input terminal of the voltage output circuit; and
a second impedance element, wherein a first terminal of the second impedance element is coupled to the output terminal of the voltage detection circuit, a second terminal of the second impedance element is coupled to the second terminal of the first impedance element.

6. The memory control circuit unit as claimed in claim 3, wherein the voltage output circuit comprises:
a second comparator, configured to compare the third voltage and the internal reference voltage and generate a second comparison signal;
a second up/down counter, coupled to the second comparator and configured to generate a second count signal according to the second comparison signal; and
a second voltage divider, coupled to the second up/down counter and configured to generate the internal reference voltage according to the second count signal.

7. The memory control circuit unit as claimed in claim 3, wherein the reference voltage generator further comprises:
a memory unit, coupled to the voltage output circuit,
wherein the voltage output circuit is further configured to store a control code corresponding to the internal reference voltage in the memory unit after the internal reference voltage is generated,
wherein the voltage output circuit is further configured to generate the internal reference voltage according to the control code.

8. The memory control circuit unit as claimed in claim 3, wherein a part of electronic elements in the voltage output circuit are disabled after the internal reference voltage is generated.

9. The memory control circuit unit as claimed in claim 1, wherein the first impedance characteristic corresponds to an impedance characteristic of an on-die termination impedance element of the memory controller,
wherein the second impedance characteristic corresponds to an impedance characteristic of an off-chip driver impedance element of the volatile memory.

10. The memory control circuit unit as claimed in claim 1, wherein the voltage value of the internal reference voltage is higher than 0.6 times the voltage value of the supply voltage.

11. The memory control circuit unit as claimed in claim 1, wherein the volatile memory is a double data rate 4 synchronous dynamic random access memory.

12. The memory control circuit unit as claimed in claim 1, wherein the voltage value of the supply voltage is lower than 1.2 Volt, and the voltage value of the internal reference voltage is not equal to half of the voltage value of the supply voltage.

13. A memory storage device, comprising:
a connection interface unit, configured to couple to a host system;
a rewritable non-volatile memory module;
a volatile memory; and
a memory control circuit unit, coupled to the connection interface unit, the rewritable non-volatile memory module and the volatile memory,
wherein the memory control circuit unit is configured to detect a first impedance characteristic of a memory controller, detect a second impedance characteristic of the volatile memory and generate an internal reference voltage according to a detection result,
wherein a voltage value of the internal reference voltage is positively correlated to a voltage value of a supply voltage of the memory controller, and the internal reference voltage is for resolving a data signal received by the memory control circuit unit.

14. The memory storage device as claimed in claim 13, wherein the memory control circuit unit comprises a memory interface, wherein the memory interface comprises:
a first connection interface, configured to couple to the memory controller;
a second connection interface, configured to couple to the volatile memory; and
a reference voltage generator, coupled to the first connection interface and the second connection interface,
wherein the reference voltage generator is configured to detect the first impedance characteristic of the memory controller via the first connection interface, detect the second impedance characteristic of the volatile memory via the second connection interface and generate the internal reference voltage according to the detection result.

15. The memory storage device as claimed in claim 14, wherein the reference voltage generator comprises:
a voltage detection circuit, configured to detect a first voltage of an on-die termination impedance element in response to the first impedance characteristic and the second impedance characteristic,
wherein a voltage value of the first voltage is positively correlated to the voltage value of the supply voltage of the memory controller.

16. The memory storage device as claimed in claim 15, wherein the reference voltage generator further comprises:
a voltage dividing circuit, coupled to the voltage detection circuit and configured to execute a voltage dividing operation on a second voltage of an output terminal of the voltage detection circuit; and
a voltage output circuit, coupled to the voltage dividing circuit and configured to generate the internal reference voltage in response to a third voltage of an output terminal of the voltage dividing circuit.

17. The memory storage device as claimed in claim 15, wherein the voltage detection circuit comprises:
a first comparator, configured to compare the first voltage and a second voltage and generate a first comparison signal;
a first up/down counter, coupled to the first comparator and configured to generate a first count signal according to the first comparison signal; and
a first voltage divider, coupled to the first up/down counter and configured to output the second voltage according to the first count signal.

18. The memory storage device as claimed in claim 16, wherein the voltage dividing circuit comprises:
a first impedance element, wherein a first terminal of the first impedance element is coupled to the supply voltage of the memory controller, a second terminal of the first impedance element is coupled to an input terminal of the voltage output circuit; and a second impedance element, wherein a first terminal of the second impedance element is coupled to the output terminal of the voltage detection circuit, a second terminal of the second impedance element is coupled to the second terminal of the first impedance element.

19. The memory storage device as claimed in claim 16, wherein the voltage output circuit comprises:
   a second comparator, configured to compare the third voltage and the internal reference voltage and generate a second comparison signal;
   a second up/down counter, coupled to the second comparator and configured to generate a second count signal according to the second comparison signal; and
   a second voltage divider, coupled to the second up/down counter and configured to generate the internal reference voltage according to the second count signal.

20. The memory storage device as claimed in claim 16, wherein the reference voltage generator further comprises:
   a memory unit, coupled to the voltage output circuit,
   wherein the voltage output circuit is further configured to store a control code corresponding to the internal reference voltage in the memory unit after the internal reference voltage is generated,
   wherein the voltage output circuit is further configured to generate the internal reference voltage according to the control code.

21. The memory storage device as claimed in claim 16, wherein a part of electronic elements in the voltage output circuit are disabled after the internal reference voltage is generated.

22. The memory storage device as claimed in claim 13, wherein the first impedance characteristic corresponds to an impedance characteristic of an on-die termination impedance element of the memory controller,
   wherein the second impedance characteristic corresponds to an impedance characteristic of an off-chip driver impedance element of the volatile memory.

23. The memory storage device as claimed in claim 13, wherein the voltage value of the internal reference voltage is higher than 0.6 times the voltage value of the supply voltage.

24. The memory storage device as claimed in claim 13, wherein the volatile memory is a double data rate 4 synchronous dynamic random access memory.

25. The memory storage device as claimed in claim 13, wherein the voltage value of the supply voltage is lower than 1.2 Volt, and the voltage value of the internal reference voltage is not equal to half of the voltage value of the supply voltage.

26. A reference voltage generation method, for a memory interface for connecting a memory controller to a volatile memory, the reference voltage generation method comprising:
   detecting a first impedance characteristic of the memory controller via a first connection interface of the memory interface and detecting a second impedance characteristic of the volatile memory via a second connection interface of the memory interface;
   generating an internal reference voltage according to a detection result, wherein a voltage value of the internal reference voltage is positively correlated to a voltage value of a supply voltage of the memory controller; and
   resolving a data signal received by the memory interface according to the internal reference voltage.

27. The reference voltage generation method as claimed in claim 26, wherein the step of resolving the data signal received by the memory interface according to the internal reference voltage comprises:
   sampling the data signal based on a rising edge of a clock signal and a falling edge of the clock signal.

28. The reference voltage generation method as claimed in claim 26, wherein the first impedance characteristic corresponds to an impedance characteristic of an on-die termination impedance element of the memory controller,
   wherein the second impedance characteristic corresponds to an impedance characteristic of an off-chip driver impedance element of the volatile memory.

29. The reference voltage generation method as claimed in claim 26, wherein the voltage value of the internal reference voltage is higher than 0.6 times the voltage value of the supply voltage.

30. The reference voltage generation method as claimed in claim 26, wherein the volatile memory is a double data rate 4 synchronous dynamic random access memory.

31. The reference voltage generation method as claimed in claim 26, wherein the voltage value of the supply voltage is lower than 1.2 Volt, and the voltage value of the internal reference voltage is not equal to half of the voltage value of the supply voltage.

* * * * *